US009177625B2

(12) United States Patent
Ko

(10) Patent No.: US 9,177,625 B2
(45) Date of Patent: Nov. 3, 2015

(54) SEMICONDUCTOR CHIP, SEMICONDUCTOR INTEGRATED CIRCUIT INCLUDING THE SEMICONDUCTOR CHIP, SEMICONDUCTOR SYSTEM INCLUDING THE SEMICONDUCTOR INTEGRATED CIRCUIT AND METHOD OF DRIVING THE SEMICONDUCTOR SYSTEM

(71) Applicant: SK hynix Inc., Gyeonggi-do (KR)

(72) Inventor: Jae-Bum Ko, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 225 days.

(21) Appl. No.: 14/019,197

(22) Filed: Sep. 5, 2013

(65) Prior Publication Data

US 2014/0313845 A1 Oct. 23, 2014

(30) Foreign Application Priority Data

Apr. 19, 2013 (KR) ........................ 10-2013-0043283

(51) Int. Cl.
*G11C 8/00* (2006.01)
*G11C 8/12* (2006.01)
*G11C 8/10* (2006.01)
*G11C 29/44* (2006.01)

(52) U.S. Cl.
CPC .. *G11C 8/12* (2013.01); *G11C 8/10* (2013.01); *G11C 2029/4402* (2013.01)

(58) Field of Classification Search
CPC ..... G11C 8/12; G11C 8/10; G11C 2029/4402

USPC .............. 365/230.02, 230.08, 230.01, 230.06
See application file for complete search history.

(56) References Cited

U.S. PATENT DOCUMENTS

| 8,400,210 B2 * | 3/2013 | Ko et al. ........................ 327/526 |
| 8,614,909 B1 * | 12/2013 | Stephens, Jr. .................... 365/63 |
| 2011/0246104 A1 * | 10/2011 | Ko et al. ......................... 702/58 |
| 2014/0062587 A1 * | 3/2014 | Koyanagi ..................... 327/595 |

FOREIGN PATENT DOCUMENTS

| KR | 1020110046893 | 5/2011 |
| KR | 1020110109369 | 10/2011 |

* cited by examiner

*Primary Examiner* — Toan Le
(74) *Attorney, Agent, or Firm* — IP & T Group LLP

(57) ABSTRACT

A semiconductor system including a semiconductor integrated circuit or a semiconductor chip, and a method of driving the semiconductor system are described. The semiconductor integrated circuit includes a plurality of semiconductor chips, at least one first chip through via suitable for penetrating through the plurality of semiconductor chips and interfacing a source ID code between the plurality of semiconductor chips, a plurality of second chip through vias suitable for penetrating through the plurality of semiconductor chips and interfacing a plurality of chip selection signals between the plurality of semiconductor chips, wherein the semiconductor chip uses one of chip selection signals as an internal chip selection signal in response to a chip ID code by selecting one of a unique ID code for the semiconductor chip and an alternative ID code for a preset semiconductor chip when the semiconductor chip fails.

21 Claims, 6 Drawing Sheets

SEMICONDUCTOR CHIP, SEMICONDUCTOR INTEGRATED CIRCUIT INCLUDING THE SEMICONDUCTOR CHIP, SEMICONDUCTOR SYSTEM INCLUDING THE SEMICONDUCTOR INTEGRATED CIRCUIT AND METHOD OF DRIVING THE SEMICONDUCTOR SYSTEM

CROSS-REFERENCE TO RELATED APPLICATIONS

The present application claims priority of Korean Patent Application No. 10-2013-0043283, filed on Apr. 19, 2013, which is incorporated herein by reference in its entirety.

BACKGROUND

1. Field

Exemplary implementations of the present invention relate to a semiconductor design technology, and more particularly, to a semiconductor chip, a semiconductor integrated circuit including the semiconductor chip, a semiconductor system including the semiconductor integrated circuit, and a method of driving the semiconductor system.

2. Description of the Related Art

Generally, a packaging technology of a semiconductor integrated circuit has been continuously developed to satisfy a demand for miniaturization of the semiconductor integrated circuit and mounting reliability thereof. Recently, various technologies of a stack package have been developed to satisfy a demand for small-sized and multi-functional electric/electronic products.

The "stack" used in a semiconductor industry refers to vertically stacking at least two semiconductor chips or packages. For example, in the case of a semiconductor memory device, a product having a memory capacity twice or more than a memory capacity which may be implemented during a semiconductor integrated process may be implemented by a stack package. Further, since the stack package may have advantages, such as the increase in memory capacity, the use efficiency of mounting density and mounting area, and the like, a research and development for the stack package has been accelerated.

The stack package may be largely manufactured by a method of stacking individual semiconductor chips and then packaging stacked semiconductor chips at a time and a method of stacking individually packaged semiconductor chips. The individual semiconductor chips of the stack package are electrically connected to each other through a metal wire, a through silicon via (TSV), and the like. In particular, the stack package using the through silicon via has a structure in which the semiconductor chips are physically and electrically connected to each other vertically through the through silicon via formed in the semiconductor chip.

Meanwhile, in the semiconductor integrated circuit having the stack package structure, different chip IDs may be allocated to the stacked semiconductor chips so as to select a desired semiconductor chip among the stacked semiconductor chips. In other words, when a chip selection code is applied to the semiconductor integrated circuit from an external controller in the state in which each chip ID is allocated to the stacked semiconductor chips, a prearranged semiconductor chip may be selected based on a previously allocated chip ID.

FIG. 1 illustrates a configuration of a conventional semiconductor integrated circuit.

The present specification describes, for example, a semiconductor integrated circuit having a quad die package (QDP) in which four semiconductor chips are stacked.

Referring to FIG. 1, a semiconductor integrated circuit includes first to fourth semiconductor chips 10, 20, 30, and 40 which are vertically stacked and electrically connected to each other through first chip through via groups TSV00 and TSV01 and second chip through via groups TSV10, TSV11, TSV12, and TSV13. In this configuration, only the first semiconductor chip 10 is connected to the outside and the second to fourth semiconductor chips 20, 30, and 40 are connected to the outside through the first semiconductor chip 10.

Each of the first to fourth semiconductor chips 10, 20, 30, and 40 includes a unique ID allocation unit, a decoder, a chip selection signal input unit, and first to fourth pads. The unique ID allocation unit 11, 21, and 41 allocates its own unique ID code ID_SLICE<0:1>. The decoder 13, 23, 33, and 43 decodes the unique ID code ID_SLICE<0:1> output from the unique ID allocation unit 11, 21, 31, and 41 to generate chip ID codes DEC_SLICE<0:3>. The chip selection signal input unit 15, 25, 35, and 45 selects any one of the first to fourth chip selection signals CS0#, CS1#, CS2#, and CS3# in response to the chip ID code DEC_SLICE<0:3> and outputs the selected chip selection signal as an internal chip selection signal CS#_SEL. The first to fourth pads PD0, PD1, PD2, and PD3 receive the first to fourth chip selection signals CS0#, CS1#, CS2#, and CS3#, respectively.

In this case, the unique ID allocation unit 11, 21, 31, and 41 outputs source ID codes UP_SLICE<0:1> transferred from the unique ID allocation units of a neighboring semiconductor chip as the unique ID codes ID_SLICE<0:1 and up-counts or down-counts the unique ID codes ID_SLICE<0:1> to be transferred to another neighboring semiconductor chip through the first chip through via groups TSV00 and TSV01. For example, the unique ID allocation unit 11 included in the first semiconductor chip 10 generates the unique ID code ID_SLICE<0:1> of '00' and up-counts the unique ID code ID_SLICE<0:1> to transfer a source ID code UP_SLICE<0:1 of '01' to the unique ID allocation unit 21 of the second semiconductor chip 20 through the first chip through via groups TSV00 and TVS01. The unique ID allocation unit 21 included in the second semiconductor chip 20 generates a unique ID code ID_SLICE<0:1> of '01' corresponding to the source ID code UP_SLICE<0:1> of '01' and up-counts the unique ID code ID_SLICE<0:1> of '01' to generate a source ID code UP_SLICE<0:1> of '10' to be transferred to the unique ID allocation unit 31 of the third semiconductor chip 30. The unique ID allocation unit 31 included in the third semiconductor chip 30 generates a unique ID code ID_SLICE<0:1> of '10' corresponding to the source ID code UP_SLICE<0:1> of '10' and up-counts the unique ID code ID_SLICE<0:1> of '10' to generates a source ID code UP_SLICE<0:1> of '11' to be transferred to the unique ID allocation unit 41 of the fourth semiconductor chip 40. The unique ID allocation unit 41 of the fourth semiconductor chip 40 generates a unique ID code ID_SLICE<0:1> corresponding to the source ID code UP_SLICE<0:1> of '11'. Meanwhile, the unique ID allocation unit 11 included in the first semiconductor chip 10 is designed to generate the unique ID code ID_SLICE<0:1> of a predefined value, for example, '00', as an input terminal of the source ID code UP_SLICE<0:1> floats.

In addition, the decoders 13, 23, 33, and 43 are a known technology, and therefore the detailed description thereof will be omitted.

FIG. 2 illustrates an internal configuration of the chip selection signal input unit 15, 25, 35, and 45.

Referring to FIG. 2, the chip selection signal input units 15, 25, 35, and 45 have the same configuration, and therefore only the chip selection signal input unit 15 included in the first semiconductor chip 10 will be representatively described below.

The chip selection signal input unit 15 includes first to fourth buffer units BUF0, BUF1, BUF2, and BUF3, a chip selection signal transfer unit 15_1 and an internal chip selection signal generation unit 15_3. Each of the first to fourth buffer units BUF0, BUF1, BUF2, and BUF3 is configured to buffer the first to fourth chip selection signals CS0#, CS1#, CS2#, and CS3# input through the first to fourth pads PD0, PD1, PD2, and PD3. The chip selection signal transfer unit 15_1 is configured to selectively transfer output signals of the first to fourth buffer units BUF0, BUF1, BUF2, and BUF3 in response to the chip ID codes DEC_SLICE<0:3>. The internal chip selection signal generation unit 15_3 is configured to logically combine output signals of the chip selection signal 15_1 to generate an internal chip selection signal CS#_SEL.

Herein, the chip selection signal transfer unit 15_1 includes a first path selection unit INV0 and INV1 configured to selectively transfer the output signal of the first buffer unit BUF0 in response to the first code DEC_SLICE<0> among the chip ID codes DEC_SLICE<0:3>, a second path selection unit INV2 and INV3 configured to selectively transfer the output signal of the second buffer unit BUF1 in response to the first and second codes DEC_SLICE<0> and DEC_SLICE<1> among the chip ID codes DEC_SLICE<0:3>, a third path selection unit IN4 and IN5 configured to selectively transfer the output signal of the third buffer unit BUF2 in response to the first and third codes DEC_SLICE<0> and DEC_SLICE<2> among the chip ID codes DEC_SLICE<0:3>, and a fourth path selection unit INV6 and INV7 configured to selectively transfer the output signal of the fourth buffer unit BUF3 in response to the first and fourth codes DEC_SLICE<0> and DEC_SLICE<3> among the chip ID codes DEC_SLICE<0:3>. The first to fourth path selection units INV0 and INV1, INV2 and INV3, INV4 and INV5, and INV6 and INV7 are serially connected to two inverters which are operated in response to the corresponding codes among the chip ID codes DEC_SLICE<0:3>. In this case, the output terminals BUF_CS0#, BUF_CS1#, BUF_CS2#, and BUF_CS3# of the inverters INV0, INV2, INV4, and INV6 of the front stage are connected to each other through second chip through via groups TSV10, TSV11, TSV12, and TSV13. As described above, since only the first to fourth pads PD0, PD1, PD2, and PD3 are connected to the outside, the first to fourth pads PD0, PD1, PD2, and PD3 and the first to fourth buffer units BUF0, BUF1, BUF2, and BUF3 which are included in the second to fourth semiconductor chips 20, 30, and 40 are in a floating state, such that the chip selection signal input units 25, 35, and 45 of the second to fourth semiconductor chips 20, 30, and 40 may be configured to receive the first to fourth chip selection signals BUF_CS0#, BUF_CS1#, BUF_CS2#, and BUF_CS3# buffered in the first semiconductor chip 10 through the second chip through via groups TS10, TSV11, TSV12 and TSV13.

Further, the internal chip selection signal generation unit 15_3 may include an OR gate which performs an OR operation on the output signal of the chip selection signal transfer unit 15_1.

Hereinafter, an operation of the semiconductor integrated circuit having the above-mentioned configuration will be described.

The unique ID allocation unit 11 included in the first semiconductor chip 10 has a floated input terminal to generate the unique ID code ID_SLICE<0:1> having a preset default value. For example, the unique ID allocation unit 11 generates the unique ID code ID_SLICE 0:1> of '00'. Next, the decoder 13 generates the chip ID code DEC_SLICE 0:3> corresponding to the unique ID code ID_SLICE<0:1>. For example, the decoder 13 generates a chip ID code DEC_SLICE<0:3> of '1000' corresponding to the unique ID code ID_SLICE<0:1> of '00'. Therefore, the chip selection signal input unit 15 finally outputs at any one of the first to fourth chip selection signals buffered by the first to fourth buffer units BUF0, BUF1, BUF2, and BUF3 as the internal chip selection signal CS#_SEL in response to the chip ID code DEC_SLICE<0:3>. For example, the chip selection signal input unit 15 selects a first chip selection signal buffered by the first buffer unit BUF0 in response to the chip ID code DEC_SLICE<0:3> of '1000' and determines whether the internal chip selection signal CS#_SEL is activated depending on whether the first chip selection signal CS0# is activated.

Meanwhile the unique ID allocation unit 11 included in the first semiconductor chip 10 outputs the source ID code UP_SLICE<0:1> generated by up-counting or down-counting the unique ID code ID_SLICE<0:1> to the second semiconductor chip 20 through the first chip through via groups TSV00 and TSV01. For example, the unique ID allocation unit 11 up-counts the unique ID code ID_SLICE<0:1> of '00' to generate the source ID code UP_SLICE<0:1> of '01'.

Next, the unique ID allocation unit 21 included in the second semiconductor chip 20 generates the unique ID code ID_SLICE<0:1> corresponding to the source ID code UP_SLICE<0:1> output from the first semiconductor chip 11. For example, the unique ID allocation unit 21 generates the unique ID code ID_SLICE<0:1> of '01'. Next, the decoder 23 generates the chip ID code DEC_SLICE<0:3> corresponding to the unique ID code ID_SLICE<0:1>. For example, the decoder 23 decodes the unique ID code ID_SLICE<0:1> of '01' to generate a chip ID code DEC_SLICE<0:3> of '0100'. Therefore, the chip selection signal input unit 25 finally outputs any one of the first to fourth chip selection signals CS0#, CS1#, CS2#, and CS3# buffered in the first semiconductor chip 10 as the internal chip selection signal CS#_SEL in response to the chip ID code DEC_SLICE<0:3>. For example, the chip selection signal input unit 25 selects the second chip selection signal buffered by the second buffer unit BUF1 in response to the chip ID code DEC_SLICE<0:3> of '0100' and determines whether the internal chip selection signal CS#_SEL is activated depending on whether the second chip selection signal CS1# is activated.

Meanwhile, the unique ID allocation unit 21 included in the second semiconductor chip 20 outputs the source ID code UP_SLICE<0:1> generated by up-counting or down-counting the unique ID code ID_SLICE<0:1> to the third semiconductor chip 30 through the first chip through via groups TSV00 and TSV01. For example, the unique ID allocation unit 21 up-counts the unique ID code ID_SLICE<0:1> of '01' to generate the source ID code UP_SLICE<0:1> of '10'.

Next, the unique ID allocation unit 31 included in the third semiconductor chip 30 generates the unique ID code ID_SLICE 0:1> corresponding to the source ID code UP_SLICE<0:1> output from the second semiconductor chip 21. For example, the unique ID allocation unit 31 generates the unique ID code ID_SLICE<0:1> of '10'. Next, the decoder 33 generates the chip ID code DEC_SLICE 0:3> corresponding to the unique ID code ID_SLICE<0:1>. For example, the decoder 33 decodes the unique ID code ID_SLICE<0:1> of '10' to generate a chip ID code DEC_SLICE<0:3> of '0010'. Therefore, the chip selection signal input unit 35 finally outputs any one of the first to fourth chip selection signals CS0#, CS1#, CS2#, and CS3# buffered in the first semiconductor chip 10 as the internal chip selection signal CS#_SEL in response to the chip ID code DEC_S-LICE<0:3>. For example, the chip selection signal input unit 35 selects a third chip selection signal buffered by the third buffer unit BUF2 in response to a chip ID code DEC_S-LICE<0:3> of '0010' and determines whether the internal chip selection signal CS#_SEL is activated depending on whether the third chip selection signal CS2# is activated.

Meanwhile, the unique ID allocation unit 31 included in the third semiconductor chip 30 outputs the source ID code UP_SLICE<0:1> generated by up-counting or down-counting the unique ID code ID_SLICE<0:1> to the fourth semiconductor chip 40 through the first chip through via groups TSV00 and TSV01. For example, the unique ID allocation unit 31 up-counts the unique ID code ID_SLICE<0:1> of '10' to generate a source ID code UP_SLICE<0:1> of '11'.

Finally, the unique ID allocation unit 41 included in the fourth semiconductor chip 40 generates the unique ID code ID_SLICE<0:1 corresponding to the source ID code UP_SLICE<0:1> output from the third semiconductor chip 30. For example, the unique ID allocation unit 41 generates a unique ID code ID_SLICE<0:1> of '11'. Next, the decoder 43 generates a chip ID code DEC_SLICE 0:3> corresponding to the unique ID code ID_SLICE<0:1>. For example, the decoder 43 decodes the unique ID code ID_SLICE<0:1> of '11' to generate a chip ID code DEC_SLICE<0:3> of '0001'. Therefore, the chip selection signal input unit 45 finally outputs any one of the first to fourth chip selection signals CS#, CS#1, CS2#, and CS3# buffered in the first semiconductor chip 10 as the internal chip selection signal CS#_SEL in response to the chip ID code DEC_SLICE<0:3>. For example, the chip selection signal input unit 45 selects the fourth chip selection signal buffered by the fourth buffer unit BUF3 in response to the chip ID code DEC_SLICE 0:3> of '0001' and determines whether the internal chip selection signal CS#_SEL is activated depending on whether the fourth chip selection signal CS3# is activated.

The semiconductor integrated circuit having the above-mentioned configuration allocates chip IDs to each semiconductor chip 10, 20, 30, and 40, thereby easily transferring the chip selection signals allocated to each semiconductor chip 10, 20, 30, and 40.

However, when any one of the semiconductor chips 10, 20, 30, and 40 fails, the semiconductor integrated circuit may not use the remaining semiconductor chips. This is because the chip ID code DEC_SLICE<0:3> is fixedly allocated to each semiconductor chip 10, 20, 30, and 40. For example, when the third semiconductor chip 30 or the fourth semiconductor chip 40 fails, the first and second semiconductor chips 10 and 20 may be used as a double die package (DDP), but when the second semiconductor chip 20 fails, the first and second semiconductor chips 10 and 20 may not used as the double die package (DDP).

SUMMARY

Various exemplary implementations of the present invention are directed to a semiconductor chip with a changeable chip ID, a semiconductor integrated circuit including the semiconductor chip, a semiconductor system including the semiconductor integrated circuit, and a method of driving the semiconductor system.

In accordance with an exemplary implementation of the present invention, a semiconductor chip includes an identification (ID) selection control unit suitable for generating an ID selection signal for use in selecting one of a unique ID code for the semiconductor chip and an alternative ID code for a preset semiconductor chip when the semiconductor chip fails, a chip ID code generation unit suitable for generating a chip ID code by selecting one of the unique ID code and the alternative ID code in response to the ID selection signal, and a chip selection signal input unit suitable for generating an internal chip selection signal by selecting one of a plurality of chip selection signals in response to the chip ID code.

In accordance with another exemplary implementation of the present invention, a semiconductor integrated circuit includes a plurality of semiconductor chips, at least one first chip through via suitable for penetrating through the plurality of semiconductor chips and interfacing a source ID code between the plurality of semiconductor chips, and a plurality of second chip through vias suitable for penetrating through the plurality of semiconductor chips and interfacing a plurality of chip selection signals between the plurality of semiconductor chips, wherein each of the plurality of semiconductor chips includes a unique ID allocation unit suitable for generating a unique ID code for the semiconductor chip and transfer the source ID code which is generated by up-counting or down-counting the unique ID code to a neighboring semiconductor chip through the first chip through via, an alternative ID allocation unit suitable for generating an alternative ID code corresponding to a unique ID code for a preset semiconductor chip to be replace for the semiconductor chip when the semiconductor chip fails, a chip ID code generation unit suitable for generating a chip ID code corresponding to one of the unique ID code and the alternative ID code in response to an ID selection signal, and a chip selection signal input unit suitable for generating an internal chip selection signal by selecting one of the plurality of chip selection signals in response to the chip ID code and transferring the plurality of chip selection signals to the neighboring semiconductor chips through the second chip through vias.

In accordance with still another exemplary implementation of the present invention, a semiconductor system includes a controller, and a semiconductor integrated circuit including a plurality of semiconductor chips, wherein each of the plurality of semiconductor chips uses a chip selection signal corresponding to one of a unique ID code for the semiconductor chip and an alternative ID code for a preset semiconductor chip when the semiconductor chip fails, among a plurality of chip selection signals applied from the controller, as an internal chip selection signal.

In accordance with still yet another exemplary implementation of the present invention, a method of driving a semiconductor system includes generating an internal chip selection signal, by a plurality of semiconductor chips, by selecting a chip selection signal corresponding to a unique ID code for the semiconductor chip, among a plurality of chip selection signals applied from a controller, when at least one of the plurality of semiconductor chips fails, allocating an alternative ID code to the failed semiconductor chip and a semiconductor chip to replace the failed semiconductor chip, and generating an internal chip selection signal, by the failed semiconductor chip and the semiconductor chip to replace the failed semiconductor chip, by selecting a chip selection signal corresponding to the alternative ID code.

DETAILED DESCRIPTION

Figure 1:
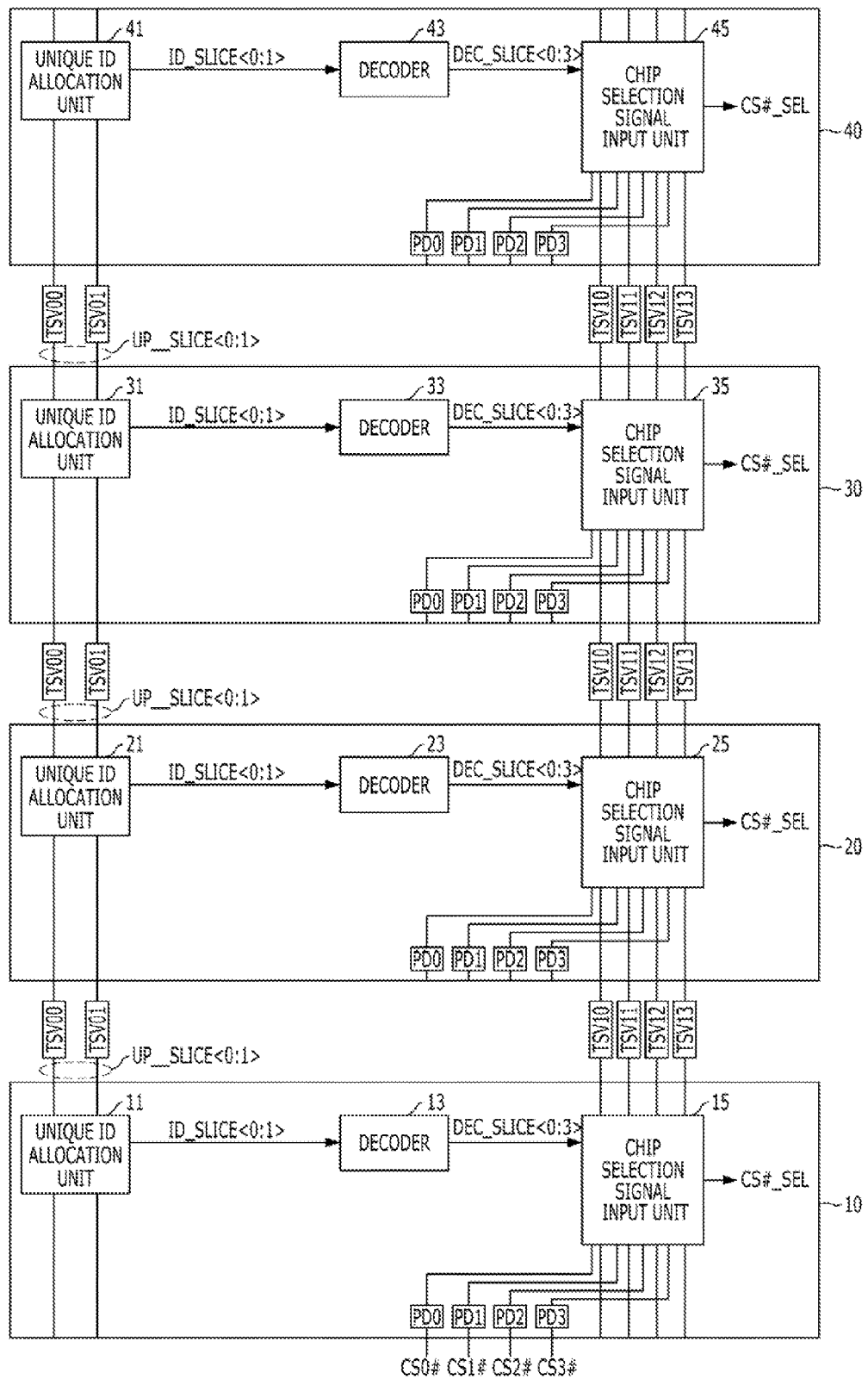
FIG. 1 is a block diagram of a conventional semiconductor integrated circuit.
Figure 2:
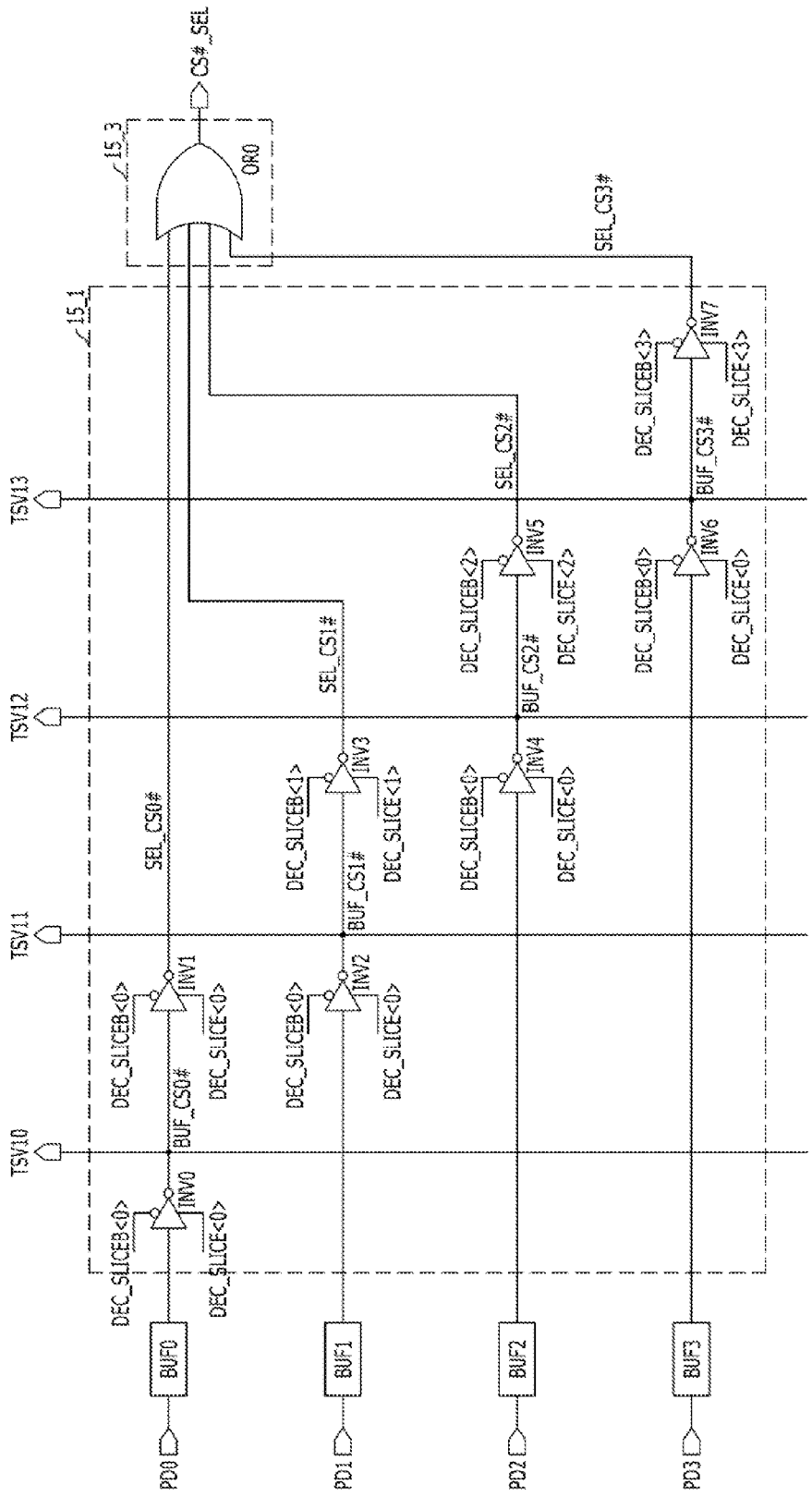
FIG. 2 is a circuit diagram of a chip selection signal input unit illustrated in FIG. 1.

Hereinafter, implementations of the present invention will be described in detail with reference to the accompanying drawings so that those skilled in the art may easily practice the present invention.

Various exemplary implementations will be described below in more detail with reference to the accompanying drawings. The present invention may, however, be embodied in different forms and should not be construed as limited to the implementations set forth herein. Rather, these implementations are provided so that this disclosure will be thorough and complete, and will fully convey the scope of the present invention to those skilled in the art. Throughout the disclosure, reference numerals correspond directly to the like numbered parts in the various figures and implementations of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence.

Figure 3:
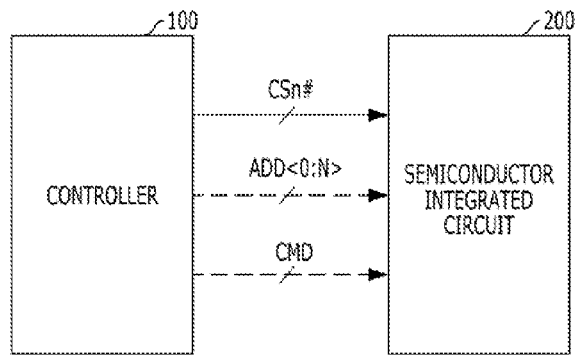
FIG. 3 is a block diagram of a semiconductor system in accordance with an exemplary implementation of the present invention.

FIG. 3 illustrates a block diagram of a semiconductor system in accordance with an exemplary implementation of the present invention.

Referring to FIG. 3, the semiconductor system includes a controller 100 and a semiconductor integrated circuit 200 suitable for receiving a plurality of chip selection signals CSn#, addresses ADD<0:N>, and commands CMD from the controller 100.

The semiconductor integrated circuit 200 comprises a plurality of semiconductor chips which are stacked. Each of the semiconductor chips serves to use a chip selection signal corresponding to a unique ID code allocated thereto, among the chip selection signals CSn# applied from the controller 100, as an internal chip selection signal, and change and use a chip selection signal corresponding to an alternative ID code TM_SLICE<0:1> as an internal chip selection signal in response to each ID selection signal TSID_SET by decoding the internal chip selection signal, the addresses ADD<0:N> and the commands CMD.

Figure 4:
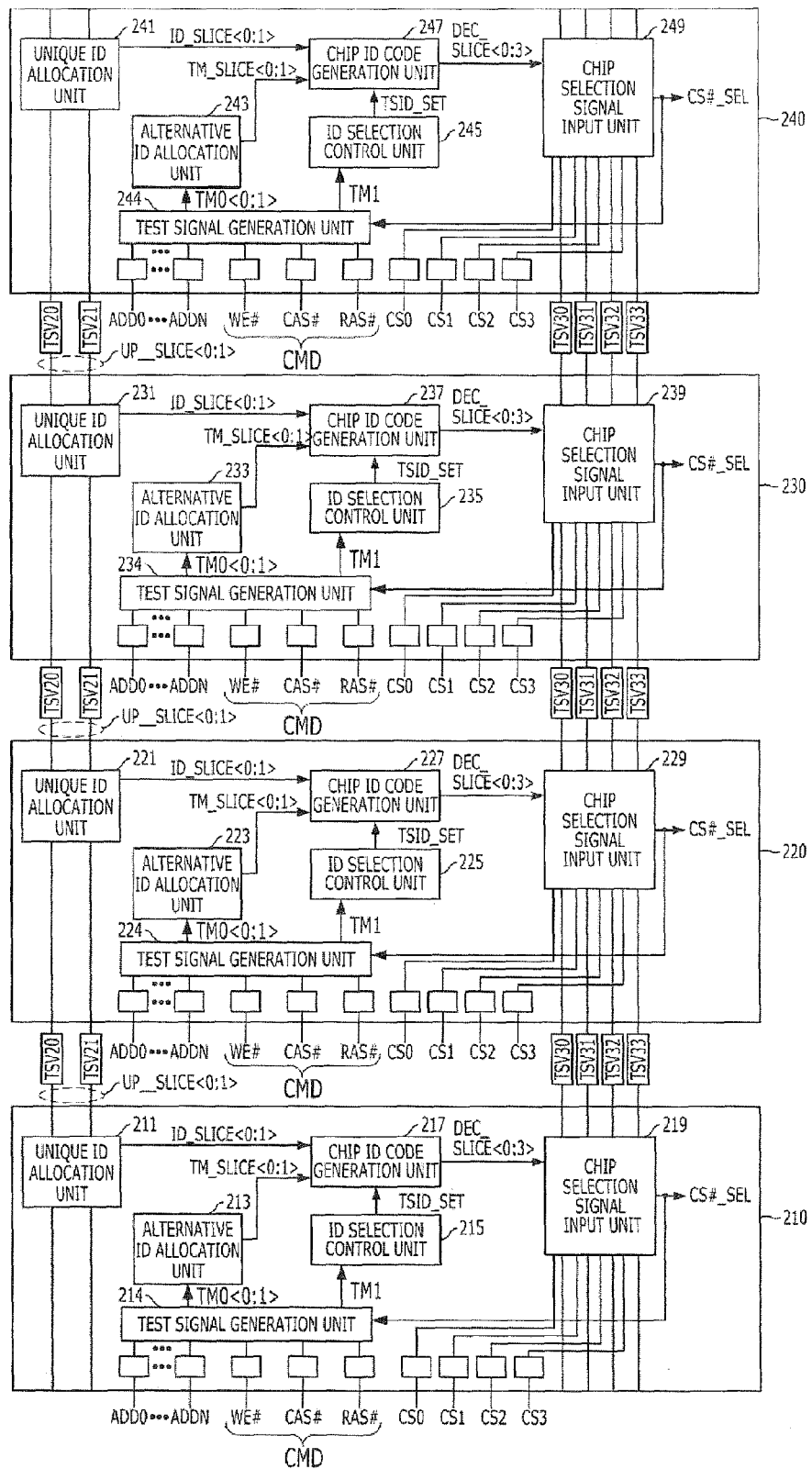
FIG. 4 is a block diagram of a semiconductor integrated circuit illustrated in FIG. 3.

FIG. 4 illustrates a block diagram of the semiconductor integrated circuit 200 illustrated in FIG. 3.

The exemplary implementation of the present invention describes, for example, the semiconductor integrated circuit having the quad die package (QDP) structure in which four semiconductor chips are stacked and the same signal as the related art be described below using the same signal name.

Referring to FIG. 4, the semiconductor integrated circuit 200 includes first to fourth semiconductor chips 210, 220, 230, and 240, first chip through via groups TSV20 and TSV21, and second chip through via groups TSV30, TSV31, TSV32, and TSV33. Each of the first chip through via groups TSV20 and TSV21 is configured to penetrate through the first to fourth semiconductor chips 210, 220, 230, and 240 and interface source ID codes UP_SLICE<0:1> between the first to fourth semiconductor chips 210, 220, 230, and 240. Each of the second chip through via groups TSV30, TSV31, TSV32, and TSV33 is configured to penetrate through the first to fourth semiconductor chips 210, 220, 230, and 240 and interface first to fourth chip selection signals CS0#, CS1#, CS2#, and CS3# between the first to fourth semiconductor chips 210, 220, 230, and 240.

In this configuration each of the first to fourth semiconductor chips 210, 220, 230, and 240 includes a unique ID allocation unit 211, 221, 231, and 241, an alternative ID allocation unit 213, 223, 233, and 243, a decoding unit 214, 224, 234, and 244, an ID selection control unit 215, 225, 235, and 245, a chip ID code generation unit 217, 227, 237, and 247, and a chip selection signal input unit 219, 229, 239, and 249.

The unique ID allocation unit 211, 221, 231, and 241 is configured to generate a unique ID code ID_SLICE<0:1> allocated thereto and transfer source ID codes UP_SLICE<0:1> which is up-counted or down-counted based on the unique ID code ID_SLICE<0:1>, to a neighboring semiconductor chip through the first chip through via groups TSV20 and TSV21. The decoding unit 214, 224, 234, and 244 is configured to decode the internal chip selection signal CS#_SEL, the addresses ADD<0:N>, and the commands CMD such as a write enable signal WE#, a column address strobe signal CAS#, and a row address strobe signal RAS#, and generate first and second raw signals TM0<0:1> and TM1. The alternative ID allocation unit 213, 223, 233, and 243 is configured to generate an alternative ID code TM_SLICE<0:1> corresponding to the unique ID code ID_SLICE<0:1> allocated to any one of the first to fourth semiconductor chips 210, 220, 230, and 240 other than itself, in response to the first raw signal TM0<0:1>. The ID selection control unit 215, 225, 235, and 245 is configured to generate an ID selection signal TSID_SET in response to the second raw signal TM1. The chip ID code generation unit 217, 227, 237, and 247 is configured to generate a chip ID code DEC_SLICE<0:3> corresponding to any one of the unique ID code ID_SLICE<0:1> and the alternative ID code TM_SLICE<0:1> in response to the ID selection signal TSID_SET. The chip selection signal input unit 219, 229, 239, and 249 is configured to generate an internal chip selection signal CS#_SEL corresponding to any one of the first to fourth chip selection signals CS0#, CS1#, CS2#, and CS3# in response to the chip ID code DEC_SLICE 0:3>, buffer the first to fourth chip selection signals CS0#, CS1#, CS2#, and CS3#, and then transfer the buffered first to fourth chip selection signals CS0#, CS1#, CS2#, and CS3# to the neighboring semiconductor chip through the second chip through via groups TSV30, TSV31, TSV32, and TSV33.

In this case, the unique ID allocation unit 211, 221, 231, and 241 outputs the source ID codes UP_SLICE<0:1> transferred from the unique ID allocation units of the neighboring semiconductor chip as the unique ID codes ID_SLICE<0:1>, and up-counts or down-counts the unique ID codes ID_SLICE<0:1> to be transferred to another neighboring semiconductor chip through the first chip through via groups TSV20 and TSV21.

For example, the unique ID allocation unit 211 included in the first semiconductor chip 210 generates a unique ID code ID_SLICE 0:1> of '00' and up-counts the unique ID code ID_SLICE<0:1> to transfer a source ID code UP_SLICE<0:1 of '01' to the unique ID allocation unit 221 of the second semiconductor chip 220 through the first chip through via groups TSV20 and TVS21. The unique ID allocation unit 221 included in the second semiconductor chip 220 generates a unique ID code ID_SLICE<0:1> of '01' corresponding to a source ID code UP_SLICE<0:1> of '01' and up-counts the unique ID code ID_SLICE<0:1> of '01' to generate a source ID code UP_SLICE<0:1> of '10' to be transferred to the unique ID allocation unit 231 of the third semiconductor chip 230. The unique ID allocation unit 231 included in the third semiconductor chip 230 generates a unique ID code ID_SLICE<0:1> of '10' corresponding to the source ID code UP_SLICE<0:1> of '10' and up-counts the unique ID code ID_SLICE<0:1> of '10' to generates a source ID code UP_SLICE<0:1> of '11' to be transferred to the unique ID allocation unit 241 of the fourth semiconductor chip 240. The unique ID allocation unit 241 of the fourth semiconductor chip 240 generates a unique ID code ID_SLICE<0:1> corresponding to the source ID code UP_SLICE<0:1> of '11'. Meanwhile, the unique ID allocation unit 211 included in the first semiconductor chip 210 may be designed to generate the unique ID code ID_SLICE<0:1> of a predefined value, for example, '00' as an input terminal of the source ID code UP_SLICE<0:1> floats.

Further, when any of the semiconductor chips 210, 220, 230, and 240 has a failure, the alternative ID allocation unit 213, 223, 233, and 243 included in the semiconductor chips 210, 220, 230, and 240 having a failure generates the alternative ID code TM_SLICE<0:1> corresponding to the unique ID code ID_SLICE 0:1> of the semiconductor chips 210, 220, 230, and 240 which is to be replaced, in response to the first raw signal TM0<0:1>. Herein, the alternative ID allocation unit 213, 223, 233, and 243 is designed to constantly keep the alternative ID code TM_SLICE<0:1> to be the predefined value. For example, the alternative ID allocation unit 213, 223, 233, and 243 may include a fuse circuit which may include an e-fuse unit to program the alternative ID code TM_SLICE<0:1> in response to the first raw signal TM0<0:1>, or may include a latch circuit configured to latch the first raw signal TM0<0:1> to output the alternative ID code TM_SLICE<0:1>.

Further, the ID selection control unit 215, 225, 235, and 245 is designed to constantly keep the ID selection signal TSID_SET as the predefined value. For example, the ID selection control unit 215, 225, 235, and 245 may include a fuse circuit which may include an e-fuse unit to program the ID selection signal TSID_SET in response to the second raw signal TM1 or may include a latch circuit configured to latch the second raw signal TM1 to output the ID selection signal TSID_SET.

Figure 5:
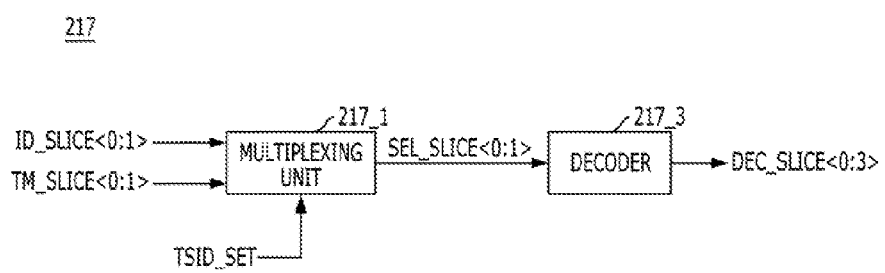
FIG. 5 is a block diagram of a chip ID code generation unit illustrated in FIG. 4.

FIG. 5 illustrates the block diagram of the chip ID generation unit 217, 227, 237, and 247 illustrated in FIG. 4. The chip ID code generation units 217, 227, 237, and 247 have the same configuration, and therefore only the chip ID code generation unit 217 included in the first semiconductor chip 210 will be representatively described below.

Referring to FIG. 5, the chip ID code generation unit 217 includes a multiplexing unit 217_1 and a decoder 217_3. The multiplexing unit 217_1 is configured to select and output any one of the unique ID code ID_SLICE<0:1> and the alternative ID code TM_SLICE<0:1> in response to the ID selection signal TSID_SET. The decoder 217_3 is configured to decode a code SEL_SLICE<0:1> output from the multiplexing unit 217_1 to output the chip ID code DEC_SLICE<0:3>. The multiplexing unit 217_1 and the decoder 217_3 are a known technology to a person in the art, and therefore the detailed description thereof will be omitted.

Figure 6:
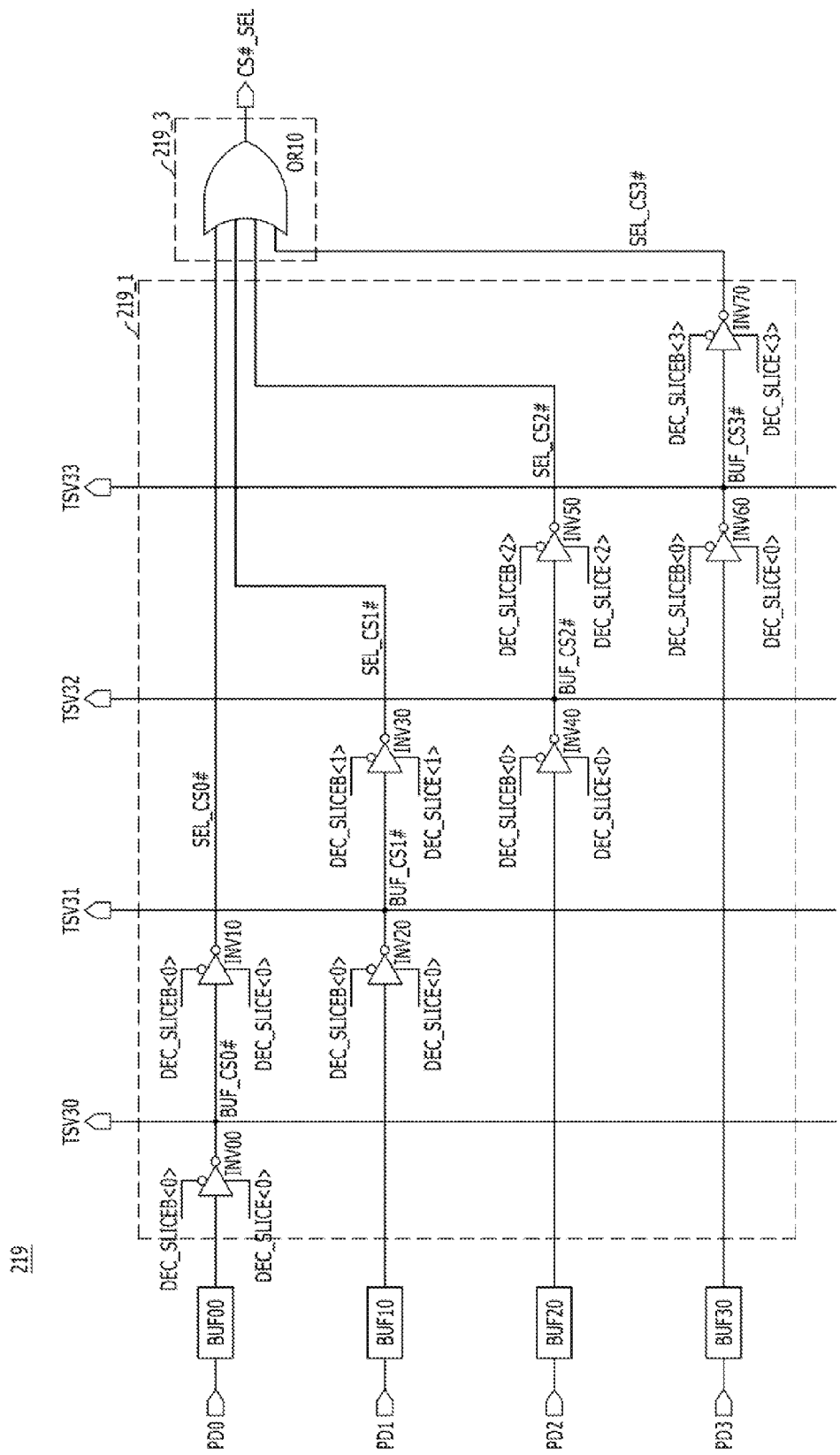
FIG. 6 is a circuit diagram of a chip selection signal input unit illustrated in FIG. 4.

FIG. 6 illustrates the internal diagram of the chip ID generation unit 219, 229, 239, and 249 illustrated in FIG. 4. The chip selection signal input units 219, 229, 239, and 249 have the same configuration, and therefore only the chip selection signal input unit 219 included in the first semiconductor chip 210 will be representatively described below.

Referring to FIG. 6, the chip selection signal input unit 219 includes first to fourth buffer units BUF00, BUF10, BUF20, and BUF30 configured to each buffer the first to fourth chip selection signals CS0#, CS1#, CS2#, and CS3# input through the first to fourth pads PD0, PD1, PD2, and PD3, a chip selection signal transfer unit 219_1 configured to selectively transfer output signals of the first to fourth buffer units BUF00, BUF10, BUF20, and BUF30 in response to the chip ID codes DEC_SLICE<0:3>, and an internal chip selection signal generation unit 219_3 configured to logically combine an output signal of a chip selection signal 219_1 to generate the internal chip selection signal CS#_SEL.

Herein, the chip selection signal transfer unit 219_1 includes first to fourth path selection units. The first path selection units INV00 and INV10 are configured to selectively transfer the output signal of the first buffer unit BUF00 in response to first code DEC_SLICE<0> and DEC_SLICEB<0> among the chip ID codes DEC_SLICE<0:3>. The second path selection units INV20 and INV30 are configured to selectively transfer the output signal of the second buffer unit BUF10 in response to first and second codes DEC_SLICE<0> and DEC_SLICEB<0> and DEC_SLICE<1> and DEC_SLICEB<1> among the chip ID codes DEC_SLICE<0:3>. The third path selection units IN40 and IN50 are configured to selectively transfer the output signal of the third buffer unit BUF20 in response to the first and third codes DEC_SLICE<0> and DEC_SLICEB<0> and DEC_SLICE<2> and DEC_SLICEB<2> among the chip ID codes DEC_SLICE<0:3>. The fourth path selection units INV60 and INV70 configured to selectively transfer the output signal of the fourth buffer unit BUF3 in response to the first and fourth codes DEC_SLICE<0> and DEC_SLICEB<0> and DEC_SLICE 3> and DEC_SLICEB<3> among the chip ID codes DEC_SLICE<0:3>. The first to fourth path selection units INV00 and INV10, INV20 and INV30, INV40 and INV50, and INV60 and INV70 are serially connected to two inverters which are operated in response to the corresponding codes among the chip ID codes DEC_SLICE<0:3>. In this case, output terminals BUF_CS0#, BUF_CS1#, BUF_CS2#, and BUF_CS3# of the inverters INV00, INV20, INV40, and INV60 of the front stage are connected to each other through second chip through via groups TSV30, TSV31, TSV32, and TSV33. As described above, since only the first to fourth pads PD0, PD1, PD2, and PD3 included in the first semiconductor chip 210 are connected to the controller 100, the first to fourth pads PD0, PD1, PD2, and PD3 and the first to fourth buffer units BUF00, BUF10, BUF20, and BUF30 which are included in the second to fourth semiconductor chips 220, 230, and 240 are in a floating state, such that the chip selection signal input units 229, 239, and 249 of the second to fourth semiconductor chips 220, 230, and 240 may be configured to receive the first to fourth chip selection signals BUF_CS0#, BUF_CS1#, BUF_CS2#, and BUF_CS3# buffered in the first semiconductor chip 210 through the second chip through via groups TSV30, TSV31, TSV32, and TSV33.

Further, the internal chip selection signal generation unit 219_3 may include an OR gate OR10 which performs an OR operation on the output signal of the chip selection signal transfer unit 219_1.

Hereinafter, a method of driving a semiconductor system in accordance with the implementation of the present invention having the above-mentioned configuration will be described.

The method of driving a semiconductor system in accordance with the exemplary implementation of the present invention includes a unique ID code using step, an alternative ID code allocation step, and an alternative ID code using step. In the unique ID code using step, the first to fourth semiconductor chips 210, 220, 230, and 240 use the chip selection signal corresponding to the unique ID code ID_SLICE<0:1> allocated thereto, among the first to fourth selection signals CS0#, CS1#, CS2#, and CS # applied from the controller 100, as the internal chip selection signal CS#_SEL. When at least one of the first to fourth semiconductor chips 210, 220, 230, and 240 fails, in alternative ID code allocation step, the alternative ID code TM_SLICE<0:1> is allocated to failed semiconductor chips and semiconductor chips to be replaced for the failed semiconductor chips, among the first to fourth semiconductor chips 210, 220, 230, and 240. In the alternative ID code using step, the failed semiconductor chips and the semiconductor chips to be replaced use the chip selection signal corresponding to the alternative ID code TM_SLICE<0:1> allocated thereto, among the first to fourth chip selection signals CS0#, CS1#, CS2# and CS3#, as the internal chip selection signal CS#_SEL. Hereinafter the case in which the second semiconductor chip 220 among the first to fourth semiconductor chips 210, 220, 230, and 240 fails, such that the failed second semiconductor chip 220 and the normal fourth semiconductor chip 240 are replaced with each other will be described as an example.

First, a process of allocating the unique ID code ID_SLICE<0:1> to the first to fourth semiconductor chips 210, 220, 230, and 240 is described.

The unique ID allocation unit 211 included in the first semiconductor chip 211 has a floated input terminal to generate the unique ID code ID_SLICE<0:1> having a preset default value. For example, the unique ID allocation unit 211 generates the unique ID code ID_SLICE<0:1> of '00'. In this case, the chip ID code generation unit 217 generates the chip ID code DEC_SLICE<0:3> corresponding to the unique ID code ID_SLICE<0:1> in response to the ID selection signal TSIDE_SET. For example, the chip ID code generation unit 217 generates the chip ID code DEC_SLICE<0:3> of '1000' corresponding to the unique ID code ID_SLICE<0:1> of '00'. Therefore, the chip selection signal input unit 219 finally outputs any one of the first to fourth chip selection signals buffered by the first to fourth buffer units BUF00, BUF10, BUF20 and BUF30 as the internal chip selection signal CS#_SEL in response to the chip ID code DEC_SLICE<0:3>. For example, the chip selection signal input unit 219 selects the first chip selection signal buffered by the first buffer unit BUF00 in response to the chip ID code DEC_SLICE 0:3> of '1000' and determines whether the internal chip selection signal CS#_SEL is activated depending on whether the first chip selection signal CS0# is activated.

Meanwhile, the unique ID allocation unit 211 included in the first semiconductor chip 210 outputs the source ID code UP_SLICE<0:1> generated by up-counting or down-counting the unique ID code ID_SLICE<0:1> to the second semiconductor chip 220 through the first chip through via groups TSV20 and TSV21. For example, the unique ID allocation unit 211 up-counts the unique ID code ID_SLICE<0:1> of '00' to generate the source ID code UP_SLICE<0:1> of '01'.

Next, the unique ID allocation unit 220 included in the second semiconductor chip 221 generates the unique ID code ID_SLICE<0:1> corresponding to the source ID code UP_SLICE<0:1> output from the first semiconductor chip 210. For example, the unique ID allocation unit 221 generates the unique ID code ID_SLICE<0:1> of '01'. In this case, the chip ID code generation unit 227 generates the chip ID code DEC_SLICE<0:3> corresponding to the unique ID code ID_SLICE<0:1> in response to the ID selection signal TSIDE_SET. For example, the chip ID code generation unit 227 generates the chip ID code DEC_SLICE<0:3> of '0100' corresponding to the unique ID code ID_SLICE<0:1> of '01'. Therefore, the chip selection signal input unit 229 finally outputs any one of the first to fourth chip selection signals CS0#, CS1#, CS2#, and CS3# buffered in the first semiconductor chip 210 as the internal chip selection signal CS#_SEL in response to the chip ID code DEC_SLICE<0:3>. For example, the chip selection signal input unit 229 selects the second chip selection signal buffered by the second buffer unit BUF10 in response to the chip ID code DEC_SLICE<0:3> of '0100' and determines whether the internal chip selection signal CS#_SEL is activated depending on whether the second chip selection signal CS1# is activated.

Meanwhile, the unique ID allocation unit 221 included in the second semiconductor chip 220 outputs the source ID code UP_SLICE<0:1> generated by up-counting or down-counting the unique ID code ID_SLICE<0:1> to the third semiconductor chip 230 through the first chip through via groups TSV20 and TSV21. For example, the unique ID allocation unit 221 up-counts the unique ID code ID_SLICE<0:1> of '01' to generate the source ID code UP_SLICE<0:1> of '10'.

Next, the unique ID allocation unit 231 included in the third semiconductor chip 230 generates the unique ID code ID_SLICE<0:1> corresponding to the source ID code UP_SLICE<0:1> output from the second semiconductor chip 220. For example, the unique ID allocation unit 231 generates the unique ID code ID_SLICE<0:1> of '10'. In this case, the chip ID code generation unit 237 generates the chip ID code DEC_SLICE<0:3> corresponding to the unique ID code ID_SLICE<0:1> in response to the ID selection signal TSIDE_SET. For example, the chip ID code generation unit 237 generates the chip ID code DEC_SLICE<0:3> of '0010' corresponding to the unique ID code ID_SLICE<0:1> of '10'. Therefore, the chip selection signal input unit 239 finally outputs any one of the first to fourth chip selection signals CS0#, CS1#, CS2#, and CS3# buffered in the first semiconductor chip 210 as the internal chip selection signal CS#_SEL in response to the chip ID code DEC_SLICE<0:3>. For example, the chip selection signal input unit 239 selects a third chip selection signal buffered by the third buffer unit BUF2 in response to a chip ID code DEC_SLICE<0:3> of '0010' and determines whether the internal chip selection signal CS#_SEL is activated depending on whether the third chip selection signal CS2# is activated.

Meanwhile, the unique ID allocation unit 230 included in the third semiconductor chip 230 outputs the source ID code UP_SLICE<0:1> generated by up-counting or down-counting the unique ID code ID_SLICE<0:1> to the fourth semiconductor chip 240 through the first chip through via groups TSV20 and TSV21. For example, the unique ID allocation unit 231 up-counts the unique ID code ID_SLICE<0:1> of '10' to generate the source ID code UP_SLICE<0:1> of '11'.

Finally, the unique ID allocation unit 241 included in the fourth semiconductor chip 240 generates the unique ID code ID_SLICE<0:1> corresponding to the source ID code UP_SLICE 0:1> output from the third semiconductor chip 230. For example, the unique ID allocation unit 241 generates the unique ID code ID_SLICE<0:1> of '11'. In this case, the chip ID code generation unit 247 generates the chip ID code DEC_SLICE<0:3> corresponding to the unique ID code ID_SLICE<0:1> in response to the ID selection signal TSIDE_SET. For example, the chip ID code generation unit 247 generates a chip ID code DEC_SLICE<0:3> of '0001' corresponding to the unique ID code ID_SLICE<0:1 of '11'. Therefore, the chip selection signal input unit 249 finally outputs any one of the first to fourth chip selection signals CS0#, CS1#, CS2#, and CS3# buffered in the first semiconductor chip 210 as the internal chip selection signal CS#_SEL in response to the chip ID code DEC_SLICE<0:3>. For example, the chip selection signal input unit 249 selects the fourth chip selection signal buffered by the fourth buffer unit BUF3 in response to the chip ID code DEC_SLICE<0:3> of '0001' and determines whether the internal chip selection signal CS#_SEL is activated depending on whether the fourth chip selection signal CS3# is activated.

Next, a process of allocating the alternative ID code TM_SLICE<0:1> to the failed second semiconductor chip 220 and the normal fourth semiconductor chip 240 will be described.

However, the alternative ID allocation unit 223 included in the second semiconductor chip 220 generates the alternative ID code TM_SLICE<0:1> corresponding to the unique ID code ID_SLICE<0:1> allocated to the fourth semiconductor chip 240. For example, the unique ID code ID_SLICE<0:1> allocated to the fourth semiconductor chip 240 is '11', such that the alternative ID allocation unit 223 may generate the alternative ID code TM_SLICE<0:1> of '11'. Herein, the alternative ID code TM_SLICE<0:1> may be generated by a fuse programming process in response to the first raw signal TM0<0:1>, or may be generated by latching the first raw signal TM0<0:1>.

Further, the alternative ID allocation unit 243 included in the fourth semiconductor chip 240 generates the alternative ID code TM_SLICE<0:1> corresponding to the unique ID code ID_SLICE<0:1> allocated to the second semiconductor chip 220. For example, the unique ID code ID_SLICE<0:1> allocated to the second semiconductor chip 220 is '01', such that the alternative ID allocation unit 243 may generate the alternative ID code TM_SLICE<0:1> of '01'.

As described above, the process of allocating the alternative ID code TM_SLICE<0:1> may be sequentially or simultaneously performed on the second and fourth semiconductor chips 220 and 240 at a time difference.

Finally, a process of changing the chip selection signal corresponding to the alternative ID code TM_SLICE<0:1> as the internal chip selection signal CS#_SEL will be described.

The chip ID code generation units 227 and 247 included in the second and fourth semiconductor chips 220 and 240 generate the chip ID code DEC_SLICE<0:3> corresponding to the alternative ID code TM_SLICE<0:1> in response to the ID selection signal TSID_SET. For example, the chip ID code generation unit 227 included in the second semiconductor chip 220 generates the chip ID code DEC_SLICE<0:3> of '0001' corresponding to the alternative ID code TM_SLICE<0:1> of '11'. The chip ID code generation unit 247 included in the fourth semiconductor chip 240 generates the chip ID code DEC_SLICE<0:3> of '0100' corresponding to the alternative ID code TM_SLICE 0:1> of '01'. Meanwhile, the ID selection signal TSID_SET is simultaneously transited in the second and fourth semiconductor chips 220 and 240 and is maintained at the transited logic level after the ID selection signal TSID_SET is transited. For example, the ID selection signal TSID_SET may be generated by a fuse programming process in response to the first raw signal TM0<0:1>, or may be generated by latching the first raw signal TM0<0:1>.

As the chip ID codes DEC_SLICE<0:3> output from the second and fourth semiconductor chips included in the second and fourth semiconductor chips 220 and 240 are simultaneously changed, the chip selection signal input units 229 and 249 simultaneously and selectively change any one of the first to fourth chip selection signals CS0#, CS1#, CS2#, and CS3#. For example, the chip selection signal input unit 229 included in the second semiconductor chip 220 selects the fourth chip selection signal buffered by the fourth buffer unit BUF3 in response to the chip ID code DEC_SLICE<0:3> of '0001' and determines whether the internal chip selection signal CS#SEL is activated depending on whether the fourth chip selection signal CS3# is activated. Further, the chip selection signal input unit 249 included in the fourth semiconductor chip 240 selects the second chip selection signal buffered by the second buffer unit BUF10 in response to the chip ID code DEC_SLICE<0:3> of '0001' and determines whether the internal chip selection signal CS#_SEL is activated depending on whether the second chip selection signal CS3# is activated. In other words, the fourth chip selection signal CS3# determines whether the internal chip selection signal CS#_SEL of the second semiconductor chip 220 is activated and the second chip selection signal CS1# determines whether the internal chip selection signal CS#_SEL of the fourth semiconductor chip 240 is activated.

In accordance with the exemplary implementation of the present invention, the method of exchanging the chip ID code between the failed semiconductor chip and the normal semiconductor chip may be adopted to use only the normal semiconductor chip regardless of the stacked order even which any semiconductor chip fails.

In accordance with the exemplary implementations of the present invention, even though any semiconductor chip among the plurality of stacked semiconductor chips fails, the normal semiconductor chips may be maximally used as the stack package by the method of mutually exchanging the chip IDs allocated to each semiconductor chip between the semiconductor chips. Therefore, the yield of the semiconductor integrated circuit may be improved.

Although the spirit of the present invention was described in detail with reference to the preferred implementations, it should be understood that the preferred implementations are provided to explain, but do not limit the spirit of the present invention. Also, it is to be understood that various changes and modifications within the technical scope of the present invention are made by a person having ordinary skill in the art to which this invention pertains.

What is claimed is:

1. A semiconductor chip comprising:
an identification (ID) selection control unit suitable for generating an ID selection signal for use in selecting one of a unique ID code for the semiconductor chip and an alternative ID code for a preset semiconductor chip when the semiconductor chip fails; and
a chip ID code generation unit suitable for generating a chip ID code by selecting one of the unique ID code and the alternative ID code in response to the ID selection signal; and
a chip selection signal input unit suitable for generating an internal chip selection signal by selecting one of a plurality of chip selection signals in response to the chip ID code.

2. The semiconductor chip of claim 1, further comprising:
a unique ID allocation unit suitable for generating the unique ID code by up-counting or down-counting a unique ID code allocated to a neighboring semiconductor chip; and
an alternative ID allocation unit suitable for generating the alternative ID code corresponding to a unique ID code allocated to another semiconductor chip.

3. The semiconductor chip of claim 2, wherein the unique ID allocation unit includes an adder or a subtractor.

4. The semiconductor chip of claim 2, wherein the alternative ID allocation unit includes a fuse circuit to program the alternative ID code in response to a first raw signal which is generated by decoding addresses, commands and the internal chip selection signal.

5. The semiconductor chip of claim 2, wherein the alternative ID allocation unit includes a latch unit which latches a first raw signal which is generated by decoding addresses, commands and the internal chip selection signal, to output the alternative ID code.

6. The semiconductor chip of claim 1, wherein the ID selection control unit includes a fuse circuit to program the ID selection signal in response to a second raw signal which is generated by decoding addresses, commands and the internal chip selection signal.

7. The semiconductor chip of claim 1, wherein the ID selection control unit includes a latch unit which latches a second raw signal which is generated by decoding addresses, commands and the internal chip selection signal, to output ID selection signal.

8. The semiconductor chip of claim 1, wherein the chip ID code generation unit includes:
   a multiplexing unit suitable for selecting one of the unique ID code and the alternative ID code in response to the ID selection signal; and
   a decoder suitable for decoding an ID code output from the multiplexing unit to be output as the chip ID code.

9. The semiconductor chip of claim 1, wherein the chip selection signal input unit includes:
   a plurality of buffer units suitable for buffering the plurality of chip selection signals;
   a chip selection signal transfer unit suitable for selectively transferring output signals of the plurality of buffer units in response to the chip ID code; and
   an internal chip selection signal generation unit suitable for logically combining output signals of the chip selection signal transfer unit to generate an internal chip selection signal allocated thereto.

10. A semiconductor integrated circuit comprising:
    a plurality of semiconductor chips:
    at least one first chip through via suitable for penetrating through the plurality of semiconductor chips and interfacing a source ID code between the plurality of semiconductor chips; and
    a plurality of second chip through vias suitable for penetrating through the plurality of semiconductor chips and interfacing a plurality of chip selection signals between the plurality of semiconductor chips,
    wherein each of the plurality of semiconductor chips includes:
    a unique ID allocation unit suitable for generating a unique ID code for the semiconductor chip and transferring the source ID code which is generated by up-counting or down-counting the unique ID code to a neighboring semiconductor chip through the first chip through via;
    an alternative ID allocation unit suitable for generating an alternative ID code corresponding to a unique ID code for a preset semiconductor chip to be replaced for the semiconductor chip when the semiconductor chip fails;
    a chip ID code generation unit suitable for generating a chip ID code corresponding to one of the unique ID code and the alternative ID code in response to an ID selection signal; and
    a chip selection signal input unit suitable for generating an internal chip selection signal by selecting one of the plurality of chip selection signals in response to the chip ID code and transferring the plurality of chip selection signals to the neighboring semiconductor chips through the second chip through vias.

11. The semiconductor integrated circuit of claim 10, wherein the unique ID allocation unit includes an adder or a subtractor.

12. The semiconductor integrated circuit of claim 10, wherein the alternative ID allocation unit includes a fuse circuit.

13. The semiconductor integrated circuit of claim 10, wherein the alternative ID allocation unit includes a latch unit which latches a first raw signal which is generated by decoding addresses, commands and the internal chip selection signal, to output the alternative ID code.

14. The semiconductor integrated circuit of claim 10, further comprising:
    an ID selection control unit suitable for generating the ID selection signal,
    wherein the ID selection control unit includes a fuse circuit.

15. The semiconductor integrated circuit of claim 10, further comprising:
    an ID selection control unit suitable for generating the ID selection signal,
    wherein the ID selection control unit includes a latch unit which latches a second raw signal which is generated by decoding addresses, commands and the internal chip selection signal, to output the ID selection signal.

16. The semiconductor integrated circuit of claim 10, wherein the chip ID code generation unit includes:
    a multiplexing unit suitable for selecting any one of the unique ID code and the alternative ID code in response to the ID selection signal; and
    a decoder suitable for decoding a code output from the multiplexing unit to be output as the chip ID code.

17. The semiconductor integrated circuit of claim 10, wherein the chip selection signal input unit includes:
    a plurality of buffer units suitable for buffering the plurality of chip selection signals;
    a chip selection signal transfer unit suitable for transferring output signals of the plurality of buffer units to the neighboring semiconductor chip through the second chip through via in response to the chip ID code and selecting one of the output signals of the plurality of buffer units; and
    an internal chip selection signal generation unit suitable for logically combining output signals of the chip selection signal transfer unit to generate an internal chip selection signal.

18. A semiconductor system, comprising:
    a controller; and
    a semiconductor integrated circuit including a plurality of semiconductor chips,
    wherein each of the plurality of semiconductor chips uses a chip selection signal corresponding to one of a unique ID code for the semiconductor chip and an alternative ID code for a preset semiconductor chip when the semiconductor chip fails, among a plurality of chip selection signals applied from the controller, as an internal chip selection signal.

19. A method of driving a semiconductor system, comprising:
    generating an internal chip selection signal, by a plurality of semiconductor chips, by selecting a chip selection signal corresponding to a unique ID code for the semiconductor chip, among a plurality of chip selection signals applied from a controller;
    when at least one of the plurality of semiconductor chips fails, allocating an alternative ID code to the failed semiconductor chip and a semiconductor chip to replace the failed semiconductor chip; and
    generating an internal chip selection signal, by the failed semiconductor chip and the semiconductor chip to replace the failed semiconductor chip, by selecting a chip selection signal corresponding to the alternative ID code.

20. The method of claim 19, wherein in the allocating of an alternative ID code, the alternative ID code is allocated to the failed semiconductor chip and the semiconductor chip to replace the failed semiconductor chip sequentially or simultaneously.

21. The method of claim 19, wherein the failed semiconductor chip and the semiconductor chip to replace the failed semiconductor chip simultaneously performs the changing of a chip selection signal as the internal chip selection signal.

* * * * *